US007724171B2

(12) United States Patent
Lee et al.

(10) Patent No.: US 7,724,171 B2
(45) Date of Patent: May 25, 2010

(54) DIGITAL TO ANALOG CONVERTER AND DISPLAY DRIVING SYSTEM THEREOF

(75) Inventors: Chuan-Che Lee, Sinshih Township, Tainan County (TW); Jung-Zone Chen, Sinshih Township, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 15 days.

(21) Appl. No.: 12/204,363

(22) Filed: Sep. 4, 2008

(65) Prior Publication Data

US 2010/0052964 A1 Mar. 4, 2010

(51) Int. Cl.
*H03M 1/66* (2006.01)

(52) U.S. Cl. ....................................... 341/144; 341/120

(58) Field of Classification Search ................. 341/144, 341/138, 139, 122, 120; 345/87, 88, 89, 345/99

See application file for complete search history.

(56) References Cited

U.S. PATENT DOCUMENTS

2004/0125422 A1* 7/2004 Wang et al. ................. 358/519
2007/0024544 A1* 2/2007 Chung et al. .................. 345/76

* cited by examiner

*Primary Examiner*—Brian Young
(74) *Attorney, Agent, or Firm*—Thomas, Kayden, Horstemeyer & Risley

(57) ABSTRACT

A digital to analog converter of the source driver includes a gamma voltage generator and a data decoder. The gamma voltage generator receives a gamma code to generate an analog gamma voltage. The gamma voltage includes a register, a reference decoder, and a calibrator. The register stores the gamma code. The reference decoder converts the gamma code from the register into the analog gamma voltage. The calibrator, receiving a reference gamma voltage in a calibration mode, includes a comparator and a counter, in which the counter tunes the gamma code according to the control signal generated by the comparator comparing the analog gamma voltage and the reference gamma voltage. The data decoder receives digital pixel data and selects one gamma voltage as a driving voltage based on the digital pixel data.

16 Claims, 5 Drawing Sheets

DIGITAL TO ANALOG CONVERTER AND DISPLAY DRIVING SYSTEM THEREOF

BACKGROUND

1. Field of Invention

The present invention relates to a source driver. More particularly, the present invention relates to a digital to analog converter of the source driver.

2. Description of Related Art

A liquid crystal display (LCD) has many advantages over other types of displays, and is widely used in various applications such as televisions, mobile phones, video camcorders, personal computers and so on. Image data of the LCD are provided through one or more source drivers.

FIG. 1 shows a diagram of the conventional source driver of the LCD. The source driver 100 includes the channels 108, the multiplexer 112, the output pads 114, the switch 120, and the data bus 118. The channel 108 is connected to the output pads 114 via the multiplexer 112, in which the switch 120 re-distribute the charges on the output pads 114 when the source driver powers off. Each channel 108 has a shift register 122, a latch unit 133, a level shifter 128 and a digital-to-analog converter (DAC) 130. Each latch unit 133 includes a first latch 124 and a second latch 126 connected in series.

The digital pixel data on the data bus 118 is stored in the latch units 133, and moreover, the digital pixel data is stored first in the first latch 124 and then stored in the second latch 126. The DAC 130 receives the level-shifted digital pixel data and generates driving voltage based on the level-shifted digital pixel data.

However, due to the process variation, the DACs of the channels in the same source driver may generate different analog gamma voltages even if they receive the same level-shifted digital pixel data. As a result, the source drivers may generate different driving voltages even if they receive the same level-shifted digital pixel data, which causes the image noise (band mura) on the display.

Therefore, there is a need for a source driver with improved digital to analog converters to reduce the display image noise.

SUMMARY

According to one embodiment of the present invention, a digital to analog converter of a source driver including a gamma voltage generator and a data decoder is disclosed. The data decoder receives digital pixel data and selects one analog gamma voltage from the gamma voltage generator as a driving voltage based on the digital pixel data.

The gamma voltage generator receives a gamma code to generate an analog gamma voltage. The gamma voltage generator includes a register, a reference decoder, and a calibrator. The register stores the gamma code. The reference decoder converts the gamma code from the register into the analog gamma voltage. The calibrator receives a reference gamma voltage in a calibration mode. The calibrator includes a comparator and a counter, in which the counter tunes the gamma code according to the control signal generated by the comparator comparing the analog gamma voltage and the reference gamma voltage.

According to another embodiment of the present invention, a display driving system includes a timing controller and a source driver. The timing controller outputs a digital pixel data and a gamma code. The source driver receives the digital pixel data and the gamma code, and generates a driving voltage to drive a display accordingly. The source driver includes a digital to analog converter, in which the digital to analog converter includes a gamma voltage generator and a data decoder. The data decoder receives digital pixel data and selects one analog gamma voltage as the driving voltage based on the digital pixel data.

The gamma voltage generator receives the gamma code to generate the analog gamma voltage. The gamma voltage generator includes a register, a reference decoder, and a calibrator. The register stores the gamma code. The reference decoder converts the gamma code from the register into the analog gamma voltage. The calibrator receives a reference gamma voltage in a calibration mode. The calibrator includes a comparator and a counter, in which the counter tunes the gamma code according to the control signal generated by the comparator comparing the analog gamma voltage and the reference gamma voltage.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
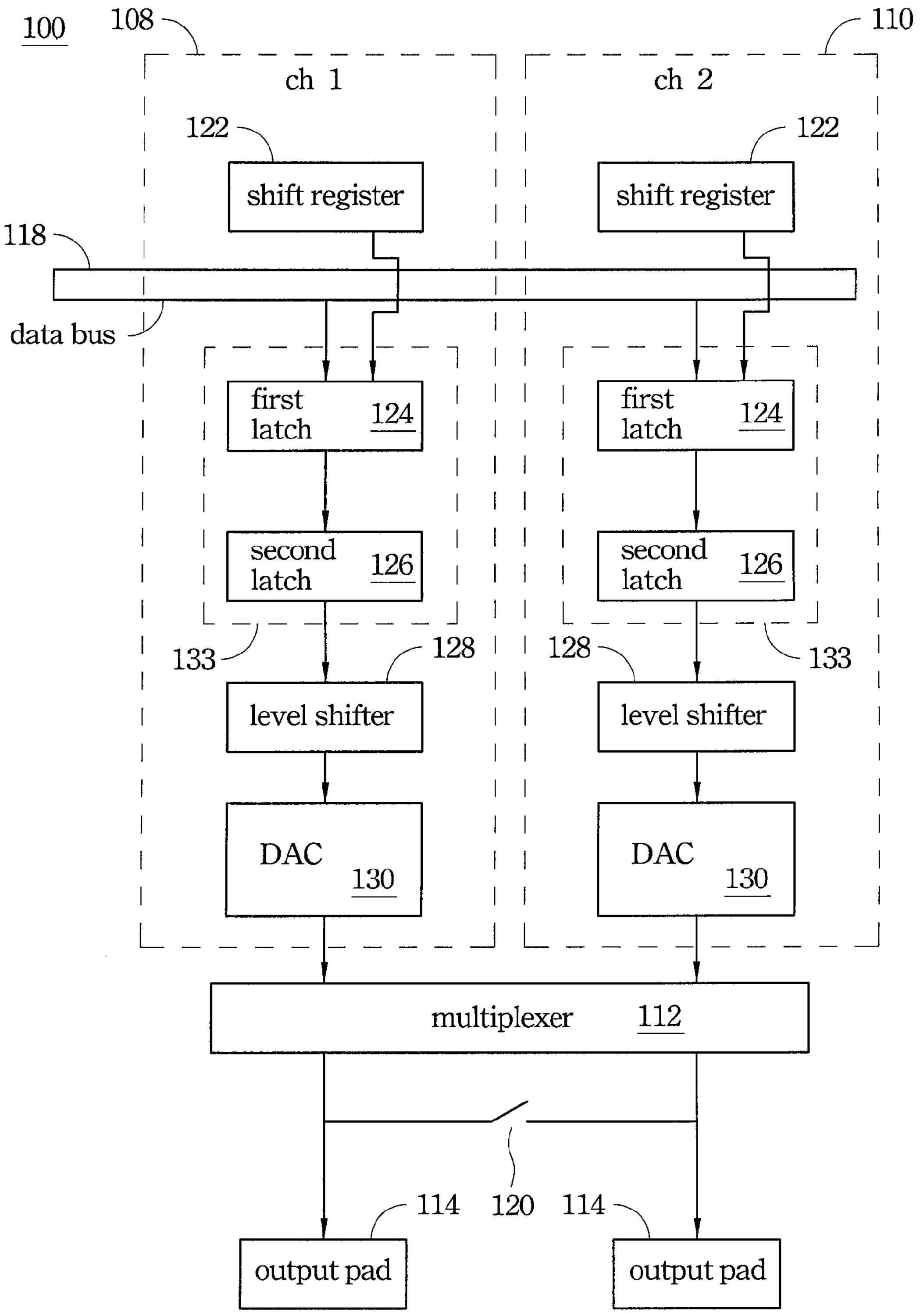
Fig. 1 (PRIOR ART)
FIG. 1 shows a diagram of the conventional source driver of the LCD.

Reference will now be made in detail to the present preferred embodiments of the invention, examples of which are illustrated in the accompanying drawings. Wherever possible, the same reference numbers are used in the drawings and the description to refer to the same or like parts.

The calibrator of the source driver in the following embodiment eliminates the analog gamma voltage offset between the source drivers due to the process variation, such that source drivers can output the same driving voltage while receiving the same digital pixel data, which reduces the image noises (band mura) of the display.

Figure 2:
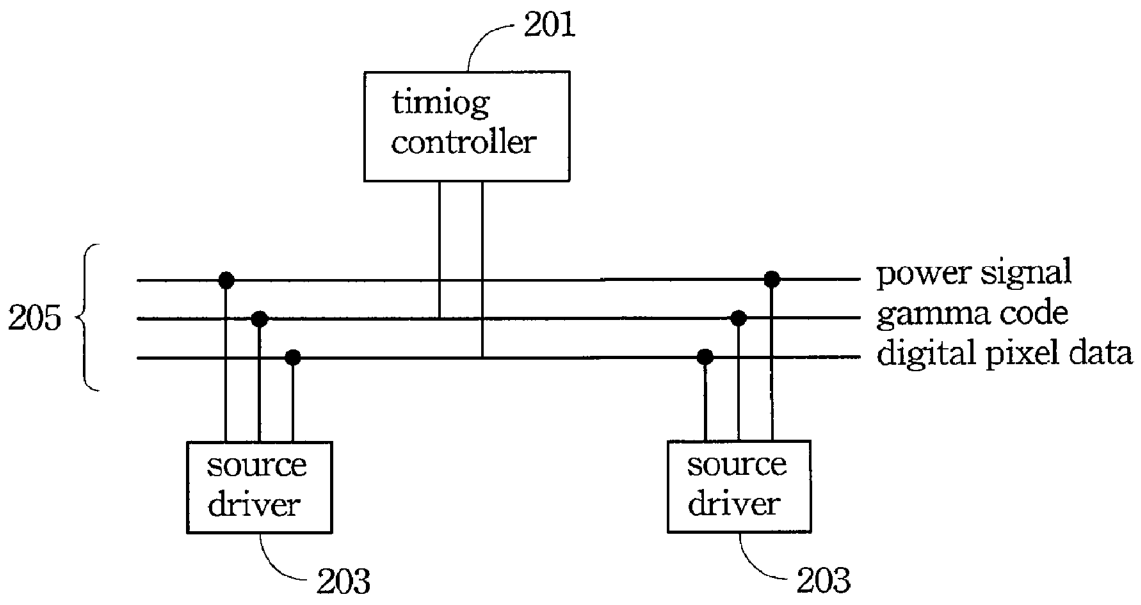
FIG. 2 shows a block diagram of a display driving system according to one embodiment of the present invention.

FIG. 2 shows a block diagram of a display driving system according to one embodiment of the present invention. The display driving system includes a timing controller 201, the source drivers 203, and the bus 205 connected between the timing controller 201 and the source driver 203. The bus 205 carries the power signal, the digital pixel data, and the gamma code which are outputted from the timing controller 201. The source drivers 203 receive the power signal, the digital pixel data and the gamma code, and generate driving voltages accordingly to drive the display panel (not shown). The gamma code is digital data for the source drivers 203 to generated analog gamma voltages.

Figure 3A:
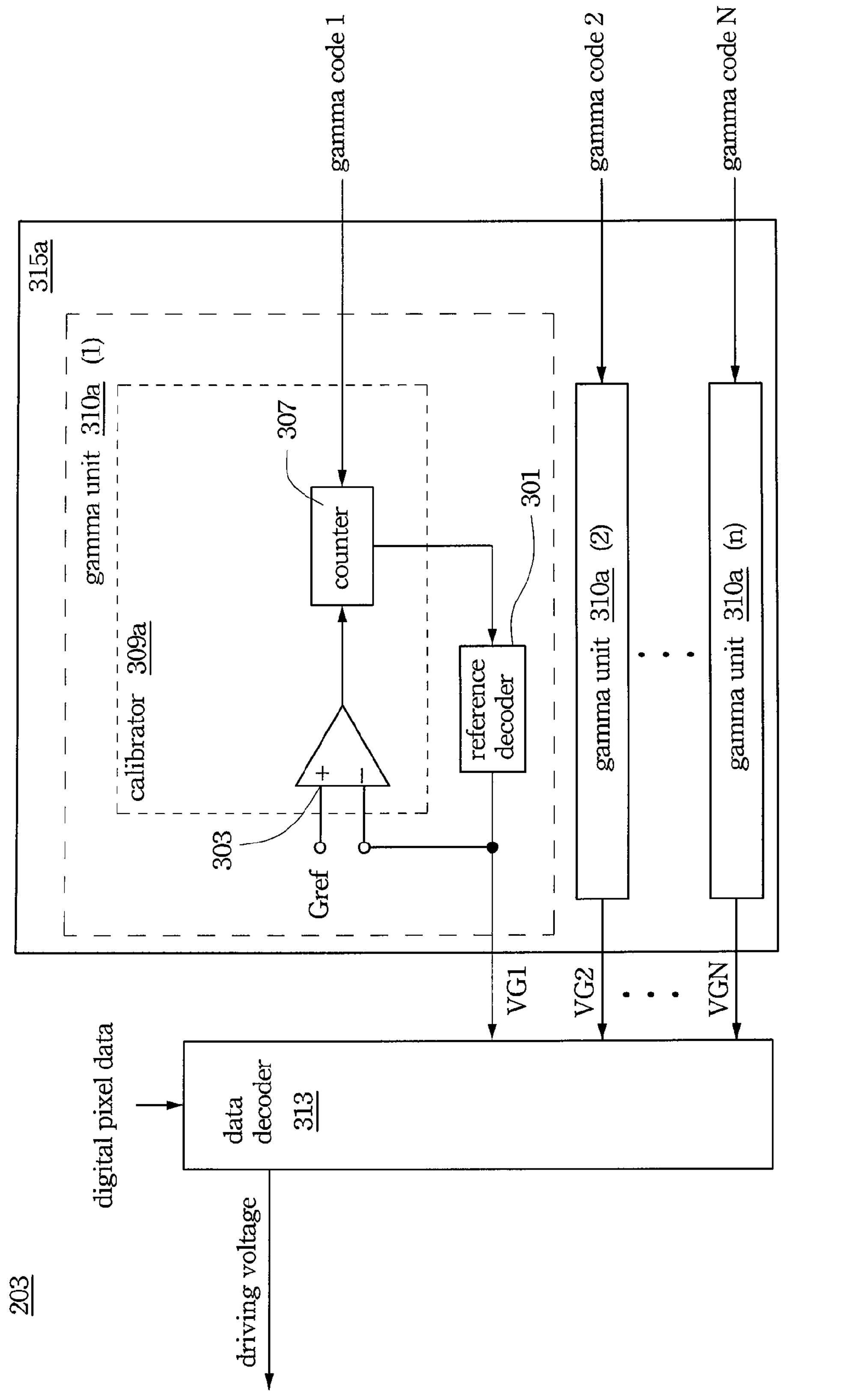
FIG. 3A shows the block diagram of the digital to analog converter in the source driver according to one embodiment of the present invention.

FIG. 3A shows the block diagram of the digital to analog converter in the source driver according to one embodiment of the present invention. The digital to analog converter (DAC) 203 includes a gamma voltage generator 315*a* and a data decoder 313. The gamma voltage generator 315*a* receives gamma codes 1~gamma code N to generate plural gamma voltages VG1-VGN. The data decoder 313 receives digital pixel data and selects one from the gamma voltages VG1-VGN as a driving voltage based on the digital pixel data.

The gamma voltage generator 315*a* includes plural gamma units 310*a* (1~N), each generates a gamma voltage based on a corresponding gamma code. The gamma unit 310*a* (1) is used as an example in the following description. The gamma unit 310*a* (1) receives the gamma code 1 to generate the analog gamma voltage VG1. The gamma unit 310*a* (1) includes a reference decoder 301 and a calibrator 309*a*. The reference decoder 301 converts the gamma code 1 from the counter 307 into the analog gamma voltage VG1. The calibrator 309*a* includes a comparator 303 and a counter 307.

While in the calibration mode, the calibrator 309*a* receives a reference gamma voltage Gref, and the control signal is the result of comparing the analog gamma voltage VG1 and the reference gamma voltage Gref by the comparator 303. The counter 307, usually implemented as an adder or subtractor to increase or decrease the gamma code stored therein, receives the gamma code 1 from the data bus in the beginning. The counter 307 also tunes the gamma code according to the control signal generated by the comparator 303. Therefore, the gamma code is calibrated by the calibrator 309*a* based on the reference gamma voltage Gref, and the gamma voltage VG1 outputted by the reference decoder is thus calibrated.

Figure 3B:
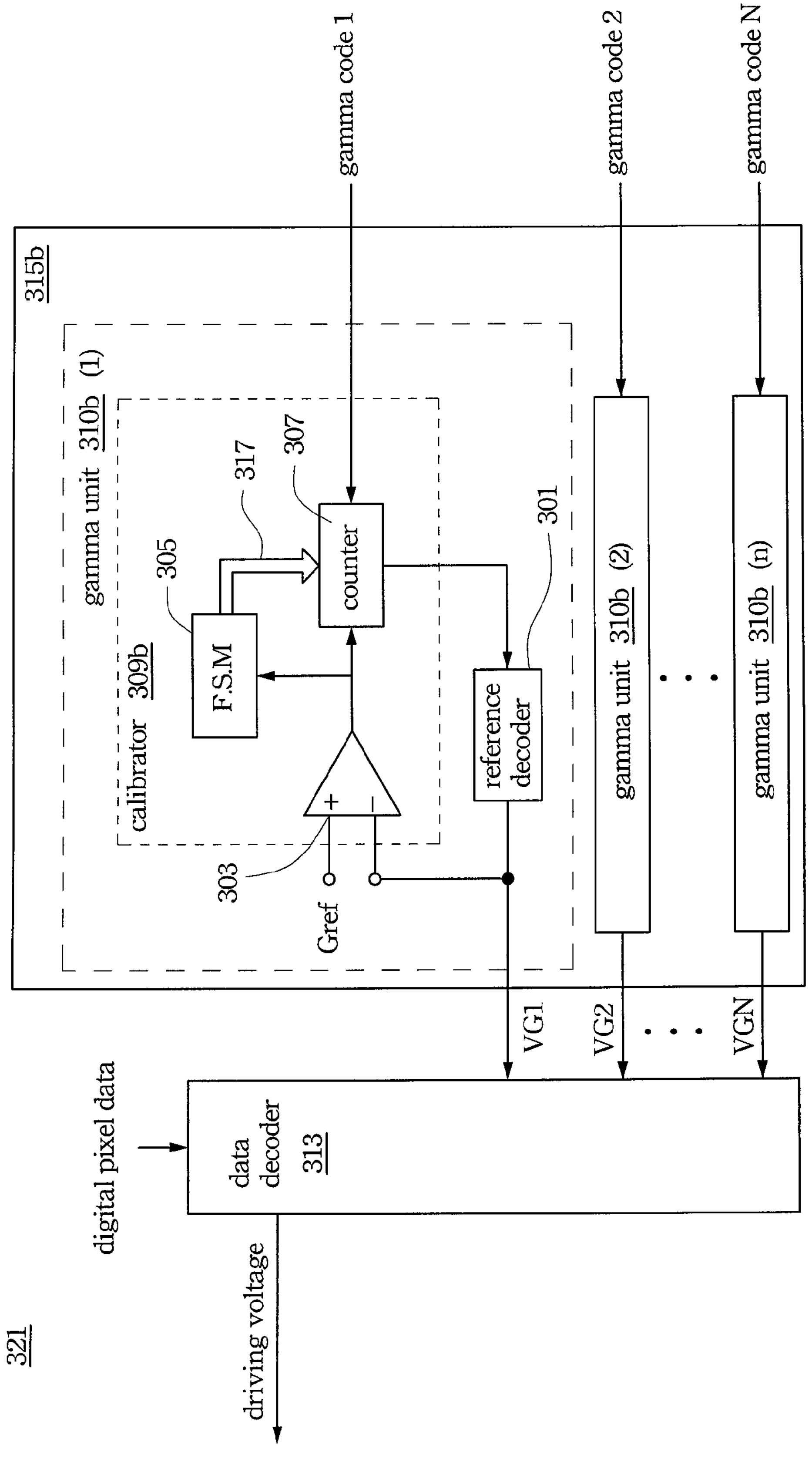
FIG. 3B shows the block diagram of the digital to analog converter in the source driver according to another embodiment of the present invention.

FIG. 3B shows the block diagram of the digital to analog converter in the source driver according to another embodiment of the present invention. The digital to analog converter (DAC) 321 includes a gamma voltage generator 315*b* and a data decoder 313. The gamma voltage generator 315*b* receives gamma codes 1~gamma code N to generate plural gamma voltages VG1-VGN. The data decoder 313 receives digital pixel data and selects one from the gamma voltages VG1-VGN as a driving voltage based on the digital pixel data.

The gamma voltage generator 315*b* includes plural gamma units 310*b* (1~N), each generates a gamma voltage based on a corresponding gamma code. The gamma unit 310*b* (1) is used as an example in the following description.

The gamma unit 310*b* (1) receives the gamma code 1 to generate the analog gamma voltage VG1. Similar to the gamma unit 310*a* (1) shown in FIG. 3A, the gamma unit 310*b* (1) also includes the reference decoder 301 and a calibrator 309*b*. The reference decoder 301 of the gamma unit 310*b* (1) converts the gamma code 1 from the counter 307 into the analog gamma voltage VG1, and the calibrator 309*b* calibrates the gamma code based on the reference gamma voltage Gref, therefore the gamma voltage VG1 outputted by the reference decoder is thus calibrated.

Different to the calibrator 309*a* shown in FIG. 3A, the calibrator 309*b* shown in FIG. 3B further includes a finite state machine (F.S.M) 305. The finite state machine 305 detects the control signal outputted from the comparator 303, and determines a lock signal 317 to lock the counter 307. The finite state machine 305 stores the control signals generated by the comparator 303 as a series of binary bits, such as 11101010, etc.

If every bit of the series binary bits and its adjacent bit have different logic value, such as 10101010 or 01010101 (which is so called as the up-dn value), it means that the analog gamma voltage VG1 is sufficiently equal to the reference gamma voltage Gref. In such case, the finite state machine 305 locks the counter 307, such that the counter 307 stops tuning the gamma code, and the calibration mode is ended.

Instead of stop tuning, the finite state machine 305 can also decrease the tuning scale of the counter 307 in order to tune the gamma code more precisely when every binary bit and its adjacent bit have different logic value. Thus, the analog gamma voltage VG1 can be tuned even close to the reference gamma voltage Gref.

Figure 4:
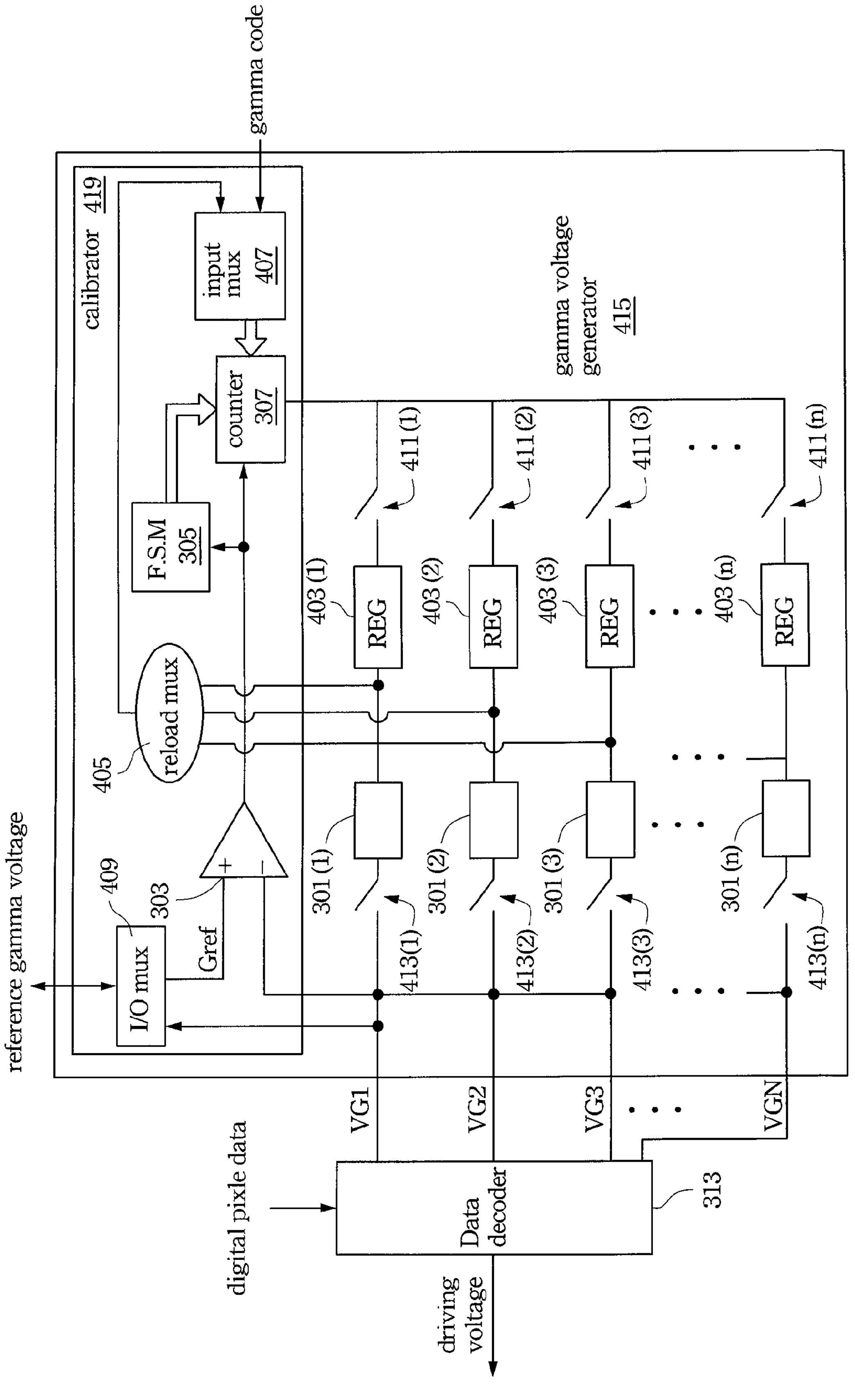
FIG. 4 shows the block diagram of the digital to analog converter in the source driver according to other embodiment of the present invention.

FIG. 4 shows the block diagram of the digital to analog converter in the source driver according to other embodiment of the present invention. The digital to analog converter of this embodiment includes the gamma voltage generator 415 and the data decoder 313. The gamma voltage generator 415 receives the gamma code to generate the analog gamma voltage VG1-VGN. The data decoder 313 receives digital pixel data and selects one of the gamma voltages VG1-VGN as the driving voltage based on the digital pixel data.

The gamma voltage generator 415 includes the calibrator 419 and the reference decoder 301 (1~N). In addition to the comparator 303, the counter 307, and the finite state machine 305, the calibrator 419 of the gamma voltage generator 415 in FIG. 4 further includes the I/O multiplexer 409, the reload multiplexer 405 and the input multiplexer 407. In the calibration mode for correcting and generating the analog gamma voltage VG1-VGN, the counter 307 initially receives the corresponding gamma code from the timing controller (201 in FIG. 2) via the input multiplexer 407, and stored the gamma code in the corresponding register 403. After the corresponding register 403 stores a corresponding gamma code, the counter 307 receives the gamma code stored in the corresponding register 403 via the input multiplexer 407 and the reload multiplexer 405.

The comparator 303 receives the gamma reference voltage Gref as a comparing basis, which is from the timing controller or from other standard source driver. The I/O multiplexer 409 outputs the gamma voltage if the source driver is used as a standard source driver, else receives reference gamma voltage from the bus to the comparator 303.

In order to convert the digital gamma code into the analog gamma voltage, the gamma voltage generator 415 also includes register 403 (1~N), input switch 411 (1~N), and output switch 413 (1~N). The input switches 411 control the connections between the counter 307 and the registers 403. In detail, the input switches 411 pass the gamma code from the counter 307 to the corresponding register 403 sequentially in the calibration mode. On the contrary, the input switches 411 disconnect the connections between the counter 307 and the registers 403 when out of the calibration mode. The registers 403 store the gamma code, and the reference decoder 301 converts the gamma code from the registers 403 into the analog gamma voltage VG1-VGN.

Different to the digital to analog converter shown in F*ig*. 3A and F*ig*. 3B, the gamma voltage generator 415 corrects and generates the analog gamma voltage VG1-VGN . . . sequentially in the calibration mode, that is, the gamma voltage generator 415 corrects and generates one analog gamma voltage at a time. Hence, only one calibrator 419 is required for the whole digital to analog converter. For example, the input switch 411 (1) is turned on in first, in order to reload the gamma code from the counter 307 into the register 403 (1). After that, the reference decoder 301 (1) converts the gamma code from the register 403 (1) into the analog gamma voltage VG1. Then the comparator 303 compares the converted analog gamma voltage VG1 and theselected reference gamma voltage Gref to generate the control signal.

The F.S.M 305 controls the counter 307 to tune the gamma code according to the control signal generated by the comparator 303. If the control signal memorized by the F.S.M 305 equals the up-down value, the F.S.M 305 locks the counter 307 and disconnects the input switch 411 (1), and the reference decoder 301 (1) adapts the gamma code stored in the register 403 (1) for generating the analog gamma voltage VG1. After the analog gamma voltage VG1 had been calibrated, the gamma voltage generator 415 continues to repeat the calibration process in order to generate and calibrate another analog gamma voltage VG2. The calibration process needs to repeat as many times as the number of the reference gamma voltage (N times in this embodiment).

After all analog gamma voltages of the respective source driver, called the standard source driver, had been corrected, the gamma voltage generator 415 of the respective source driver runs out of the calibration, and all the analog gamma voltages of the standard source driver are close enough to the corresponding reference gamma voltages Gref. Other source drivers receive the corrected analog gamma voltage from the standard source driver as their reference gamma voltage, and tune the analog gamma voltages of their own simultaneously, such that the all the analog gamma voltages generated by various source drivers can be equalized.

According to the above embodiments of the present invention, the driving system of the display can equalize the analog gamma voltages generated by various source drivers, such that the gamma voltage offset between the source drivers can be reduced, thus the band mura on the display can also be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digital to analog converter of a source driver, comprising:
- a gamma voltage generator receiving a gamma code for generating a analog gamma voltage, the gamma voltage generator comprising:
  - a register for storing the gamma code;
  - a reference decoder converting the gamma code from the register into the analog gamma voltage; and
  - a calibrator receiving a reference gamma voltage in a calibration mode, comprising:
    - a comparator for comparing the analog gamma voltage and the reference gamma voltage to generate a control signal; and
    - a counter tuning the gamma code according to the control signal; and
- a data decoder receiving digital pixel data and selecting one of the analog gamma voltages as a driving voltage based on the digital pixel data.

2. The digital to analog converter of the source driver as claimed in claim 1, wherein the calibrator further comprises a finite state machine detecting the control signal and determining a lock signal to lock the counter, whereby the calibration mode is ended when the counter is locked.

3. The digital to analog converter of the source driver as claimed in claim 2, wherein the finite state machine stores the control signal of the comparator as a series of binary bits.

4. The digital to analog converter of the source driver as claimed in claim 3, wherein the finite state machine locks the counter when every binary bit and its adjacent bit have different logic values, and the counter stops tuning the gamma code when the counter is locked.

5. The digital to analog converter of the source driver as claimed in claim 3, wherein the finite state machine decreases a tuning scale of the counter in order to tune the gamma code more precisely when every binary bit and its adjacent bit have different logic value.

6. The digital to analog converter of the source driver as claimed in claim 2, further comprising a multiplexer selecting one of a plurality of reference gamma voltages and passing the selected reference gamma voltage to the comparator in the calibration mode.

7. The digital to analog converter of the source driver as claimed in claim 6, further comprising a switch controlling a connection between the counter and the register, wherein the switch passes the gamma code from the counter to the register in the calibration mode.

8. The digital to analog converter of the source driver as claimed in claim 1, wherein the counter comprises an adder for increasing the gamma code.

9. A display driving system comprising:
- a timing controller outputting a digital pixel data and a gamma code; and
- a source driver receiving the digital pixel data and the gamma code, and generating a driving voltage accordingly, the source driver comprising a digital to analog converter, the digital to analog converter comprising:
- a gamma voltage generator receiving the gamma code for generating a analog gamma voltage, the gamma voltage generator comprising:
  - a register for storing the gamma code;
  - a reference decoder converting the gamma code from the register into the analog gamma voltage; and
  - a calibrator receiving a reference gamma voltage in a calibration mode, the calibrator comprising:
    - a comparator comparing the analog gamma voltage and the reference gamma voltage to generate a control signal; and
    - a counter tuning the gamma code according to the control signal; and
- a data decoder receiving digital pixel data and selecting one gamma voltage as the driving voltage based on the digital pixel data.

10. The display driving system as claimed in claim 9, wherein the calibrator further comprises a finite state machine detecting the control signal of the comparator, and controlling the counter to tune the gamma code.

11. The display driving system as claimed in claim 10, wherein the finite state machine stores the control signal of the comparator as a series of binary bits.

12. The display driving system as claimed in claim 11, wherein the finite state machine locks the counter when every binary bit and its adjacent bit have different logic value, such that the counter stops tuning the gamma code.

13. The display driving system as claimed in claim 11, wherein the finite state machine decreases a tuning scale of the counter in order to tune the gamma code more slightly when every binary bit and its adjacent bit have different logic value.

14. The display driving system as claimed in claim 10, wherein the calibrator further comprises a multiplexer selecting one of a plurality of reference gamma voltages and passing the selected reference gamma voltage to the comparator in the calibration mode.

15. The display driving system as claimed in claim 9, wherein the source driver further comprising a switch controlling a connection between the counter and the register, wherein the switch passes the gamma code from the counter to the register in the calibration mode.

16. The display driving system as claimed in claim 9, wherein the counter of the source driver comprises an adder for increasing the gamma code.

* * * * *